(12) United States Patent
Morita

(10) Patent No.: US 8,927,945 B2
(45) Date of Patent: Jan. 6, 2015

(54) DRAWING APPARATUS AND METHOD OF MANUFACTURING ARTICLE BY CONTROLLING DRAWING ON SHOT REGION SIDE OF BOUNDARY OF SHOT REGIONS

(75) Inventor: Tomoyuki Morita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 68 days.

(21) Appl. No.: 13/588,590

(22) Filed: Aug. 17, 2012

(65) Prior Publication Data
US 2013/0052590 A1 Feb. 28, 2013

(30) Foreign Application Priority Data

Aug. 23, 2011 (JP) ................. 2011-181578

(51) Int. Cl.
*H01J 37/302* (2006.01)
*G03F 1/70* (2012.01)
*H01J 37/317* (2006.01)

(52) U.S. Cl.
CPC ......... *H01J 37/3177* (2013.01); *H01J 37/3023* (2013.01)
USPC .................................. 250/492.22

(58) Field of Classification Search
CPC ..................... H01J 37/3177; H01J 37/3026
USPC .................................. 250/492.22
See application file for complete search history.

(56) References Cited

U.S. PATENT DOCUMENTS 5,834,783 A * 11/1998 Muraki et al. ............. 250/398
5,973,332 A 10/1999 Muraki
6,166,387 A 12/2000 Muraki
6,271,852 B1 * 8/2001 Kamiyama et al. .......... 345/423
6,313,476 B1 * 11/2001 Shimizu et al. ........ 250/492.22
6,319,642 B1 * 11/2001 Hara et al. .................. 430/30
6,323,499 B1 11/2001 Muraki
2003/0189181 A1 * 10/2003 Ohta et al. ............. 250/492.22
2006/0108547 A1 * 5/2006 Buller .................... 250/492.23
2008/0149859 A1 * 6/2008 Yasuzato ............... 250/492.22
2009/0057570 A1 * 3/2009 Abe ......................... 250/492.2
2010/0072390 A1 * 3/2010 Yashima .................. 250/396 R
2012/0221980 A1 * 8/2012 Fujimura et al. ............ 716/53

FOREIGN PATENT DOCUMENTS

JP 09-007538 A 1/1997
JP 3647128 B2 5/2005

* cited by examiner

Primary Examiner — Brooke Purinton

(74) Attorney, Agent, or Firm — Canon USA, Inc. IP Division

(57) ABSTRACT

A drawing apparatus performs drawing, with an array of charged particle beams, on shot regions arrayed on a substrate in a direction in parallel and with intervention of step movement of the substrate in the direction. The apparatus includes a driving device for relative movement between a stage and a charged-particle optical system in the direction. The optical system causes sub arrays (of charged particle beams), discretely arrayed in the direction, to be incident on the substrate, and includes deflectors configured to respectively deflect sub array sets each including at least one of the sub arrays. A controller controls the optical system and the driving device such that a region at one side of a boundary among the shot regions and a region at the other side are subjected to drawing not in parallel with a sub array existing over the boundary, but sequentially with intervention of the step movement.

4 Claims, 12 Drawing Sheets

DRAWING APPARATUS AND METHOD OF MANUFACTURING ARTICLE BY CONTROLLING DRAWING ON SHOT REGION SIDE OF BOUNDARY OF SHOT REGIONS

BACKGROUND OF THE INVENTION

1. Field of the Invention

One disclosed aspect of the embodiments relates a drawing apparatus configured to perform drawing on a substrate with a plurality of charged particle beams and a method of manufacturing an article using the drawing apparatus.

2. Description of the Related Art

A drawing apparatus configured to perform drawing on a substrate with a plurality of charged particle beams (an array of charged particle beams) has been discussed as a drawing apparatus used to manufacture a device such as a semiconductor integrated circuit (IC) (Japanese Patent Application Laid-Open No. 9-7538).

In such a drawing apparatus, when the number of charged particle beams is increased in order to increase a throughput, it is difficult to cope with aberration, a manufacturing error, or a change over time of an optical system configured to project a plurality of charged particle beams on a substrate. For this reason, a drawing apparatus that includes a deflector configured to deflect a charged particle beam for each of sub arrays constituting an array of charged particle beams has been discussed (Japanese Patent No. 3647128).

When a deflector configured to deflect a charged particle beam is provided for each sub array as discussed in Japanese Patent No. 3647128, sub arrays are arranged with space therebetween. In addition, not limited thereto, in an optical element (for example, a lens or a deflector) for a charged particle beam, spacers or joists are sometimes arranged at predetermined intervals in order to reduce bending of a thin plate such as an electrode included in the optical element. For this reason, in an array of charged particle beams, sub arrays are sometimes arranged with space therebetween.

When an array of charged particle beams is irradiated to a plurality of shot regions previously formed on a substrate, and drawing is performed on a plurality of shot regions while connecting drawing regions by sub arrays, a good throughput is obtained.

However, the following points need to be taken into consideration. In other words, the trajectory of a plurality of charged particle beams can be corrected in units of sub arrays by a deflector provided for each sub array. Further, correction in units of the sub arrays may be used to overlay a pattern to be drawn by a sub array on the position or the shape of a shot region previously formed on a substrate. For this reason, a method of performing drawing over two shot regions concurrently by a single sub array whose trajectory is adjusted based on the position or shape of one shot region is undesirable in terms of the overlay accuracy. In order to avoid this issue, it is desirable to cause a predetermined relation to be given among the size of a shot region formed on a substrate, the size of a sub array, and the size of space between sub arrays. For example, it is desirable to set the size of a sub array and the size of space to 1:1 and to set the size of a shot region to a natural-number multiple of a pitch between sub arrays. However, this setting limits the size of a chip since the size of a shot region is typically set to a natural-number multiple of the size of a chip to be manufactured.

Further, when charged particle beams at the outer edge of a sub array are not arrayed on a straight line (when an array is concave or convex), since a shot region is rectangular, it is difficult to cause the boundary of a drawing range by a sub array to match the boundary of a shot region. In this case, in order to prevent drawing from being performed over two shot regions concurrently by a single sub array, it is necessary to arrange shot regions at intervals of the width of the concavo-convex portion. In this case, the number of shot regions which can be arranged on a substrate decreases, and thus it is undesirable in terms of productivity.

SUMMARY OF THE INVENTION

One disclosed aspect of the embodiments is directed to, for example, a drawing apparatus that performs drawing on a plurality of shot regions previously formed on a substrate in parallel and that is advantageous in both overlay precision and productivity.

According to an aspect of the embodiments, a drawing apparatus which performs drawing, with an array of charged particle beams, on a plurality of shot regions arrayed on a substrate in a predetermined direction in parallel and with intervention of step movement of the substrate in the predetermined direction, includes a stage configured to hold the substrate, a charged-particle optical system configured to cause the array to be incident on the substrate held by the stage, a driving device configured to perform relative movement between the stage and the charged-particle optical system in the predetermined direction such that a drawing region on the substrate changes, and a controller, wherein the charged-particle optical system is configured to cause a plurality of sub arrays discretely arrayed in the predetermined direction, as the array, to be incident on the substrate, and including a plurality of deflectors configured to respectively deflect a plurality of sub array sets each of which includes at least one of the plurality of sub arrays, and wherein the controller is configured to control the charged-particle optical system and the driving device such that a region at one side of a boundary among the plurality of shot regions and a region at the other side of the boundary are subjected to drawing not in parallel with a sub array, among the plurality of sub arrays, existing over the boundary, but sequentially with intervention of the step movement.

Further features and aspects of the disclosure will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the embodiments and, together with the description, serve to explain the principles of the disclosure.

DESCRIPTION OF THE EMBODIMENTS

Various exemplary embodiments, features, and aspects of the disclosure will be described in detail below with reference to the drawings.

Figure 1:
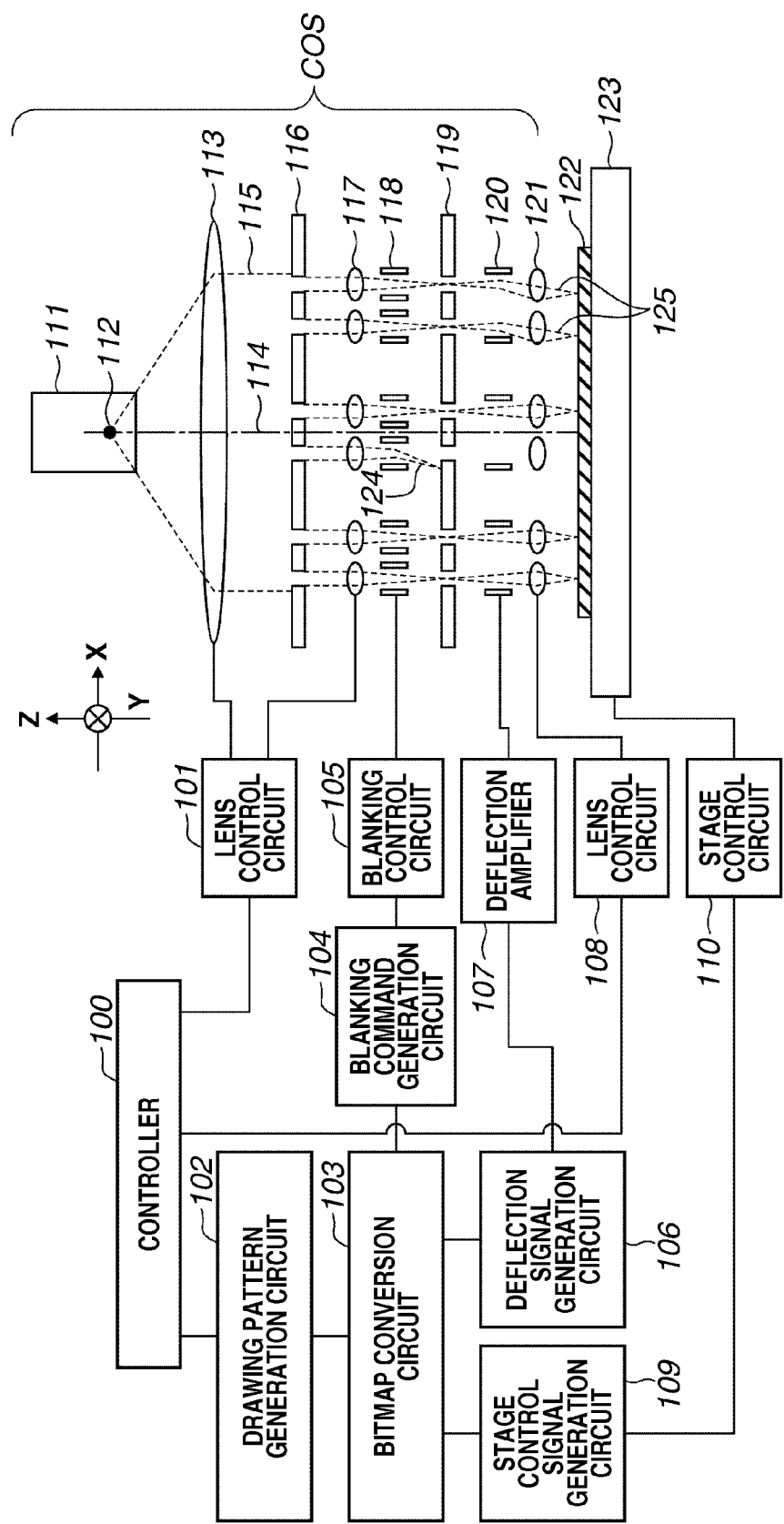
FIG. 1 is a diagram illustrating a configuration example of a drawing apparatus according to an exemplary embodiment.

FIG. 1 is a diagram illustrating a configuration example of a drawing apparatus according to a first exemplary embodiment. Particularly, FIG. 1 illustrates a configuration example of a drawing apparatus that is configured to perform drawing on a substrate with an array of a particle beam (a plurality of charged particle beams). The present exemplary embodiment will be described in connection with an example in which an electron beam is used as a charged particle beam. However, an electron beam can be replaced with a charged particle beam of any other type such as an ion beam. In FIG. 1, "COS" refers to a projection system (charged-particle optical system) configured to project an array of electron beams on a substrate held on a stage, which will be described below. An electron source (charged particle source) 111 is configured to form a crossover 112. Trajectories of electrons (charged particles) 114 and 115 are diverged from the crossover 112. The electrons diverged from the crossover 112 are converted into parallel beams by an operation of a collimator lens 113 configured to generate at least one of an electric field and a magnetic field, and then incident on an aperture array 116. The electron beam incident on the aperture array 116 is split into a plurality of electron beams, that is, an array of electron beams (an array of charged particle beams). For example, the aperture array 116 includes a plurality of apertures (for example, circular apertures) which are arranged regularly and discretely, for example, in a two-dimensional form. Here, an array of electron beams is configured such that sub arrays of electron beams are discretely arrayed with a predetermined space therebetween. Here, an array of electron beams in a sub array or a space between sub arrays is defined depending on an array of apertures in the aperture array 116. Further, the size of a sub array or a space is defined based on a factor that causes an array of charged particle beams to be configured with sub arrays of charged particle beams. Examples of the factor include the size of a deflector configured to deflect a charged particle beam for a sub array, the size of a spacer or a joist arranged to reduce bending of a thin plate such as an electrode included in an optical element (for example, a lens or a deflector) of a charged particle beam optical system, and a distance between spacers or joists.

An electron beam array formed by the aperture array 116 is incident on an electrostatic lens array 117 configured with three electrode plates (not illustrated) in which an aperture array (for example, a circular aperture array) is formed. A blanking deflector array 118 in which an aperture array having the same array as the aperture array 116 is formed is arranged at the position at which the electrostatic lens array 117 forms a crossover. The blanking deflector array 118 individually deflects electron beams in the electron beam array. An electron beam 124 deflected by the blanking deflector array 118 is shielded by a stopping aperture array 119. An aperture array having the same array as the aperture array 116 is formed in the stopping aperture array 119. The blanking deflector array 118 is controlled by the blanking control circuit 105, and individually deflects the electron beams for the sake of a blanking operation. The blanking control circuit 105 performs blanking control based on a blanking signal generated by the blanking command generation circuit 104. Further, a drawing pattern is generated by a drawing pattern generation circuit 102, and a bitmap conversion circuit 103 converts the drawing pattern into bitmap data. The blanking command generation circuit 104 generates the blanking signal based on the bitmap data.

The electron beam that has passed through the stopping aperture array 119 without being deflected by the blanking deflector array 118 forms an image of the crossover 112 on a substrate 122 through an electrostatic lens array 121. A stage unit 123 includes a movable stage configured to hold the substrate 122 and an actuator (a driving device) configured to perform relative movement in a predetermined direction between the stage and the projection system COS such that a drawing region on the substrate 122 changes.

A deflector array 120 includes deflectors each of which is provided for each sub array of electron beams. The deflector array 120 deflects the sub array through each deflector such that a position 125 of the electron beam in the sub array on the substrate 122 moves in an X-Y plane. The deflector array 120 is not limited to an example in which a deflector is provided for each sub array. For example, a deflector may be provided for every two or more sub arrays (for each sub array set), and a deflector may be provided for each electron beam. A deflection signal generation circuit 106 is configured to generate a deflection signal based on the bitmap data. A deflection amplifier 107 is configured to generate a driving signal of the deflector array 120 based on the deflection signal generated by the deflection signal generation circuit 106.

The stage unit 123 is controlled by a stage control unit 110. The stage control unit 110 performs stage positioning control based on a stage control signal generated by the stage control signal generation circuit 109. The stage control signal generation circuit 109 is configured to generate the stage control signal based on the bitmap data. The position of the stage is measured by a measurement device (not illustrated) such as a laser length measurement device, and a measurement result is used for stage positioning control. During drawing, the substrate 122 is scanned (main scanning) with an array of electron beams in parallel with movement (sub scanning) of the stage. For this reason, stage positioning control by the stage control unit 110, control of the deflector array 120 by the deflection amplifier 107, and control of the blanking deflector array 118 by the blanking control circuit 105 are in synchronization with one another. In this way, drawing is performed on the substrate 122 with an array of electron beams.

The collimator lens 113 and the electrostatic lens array 117 are controlled by a lens control circuit 101, and the electrostatic lens array 121 is controlled by a lens control circuit 108.

The drawing operation performed by the above-described circuits 101 to 110 is performed under control of a controller 100.

Figure 2:
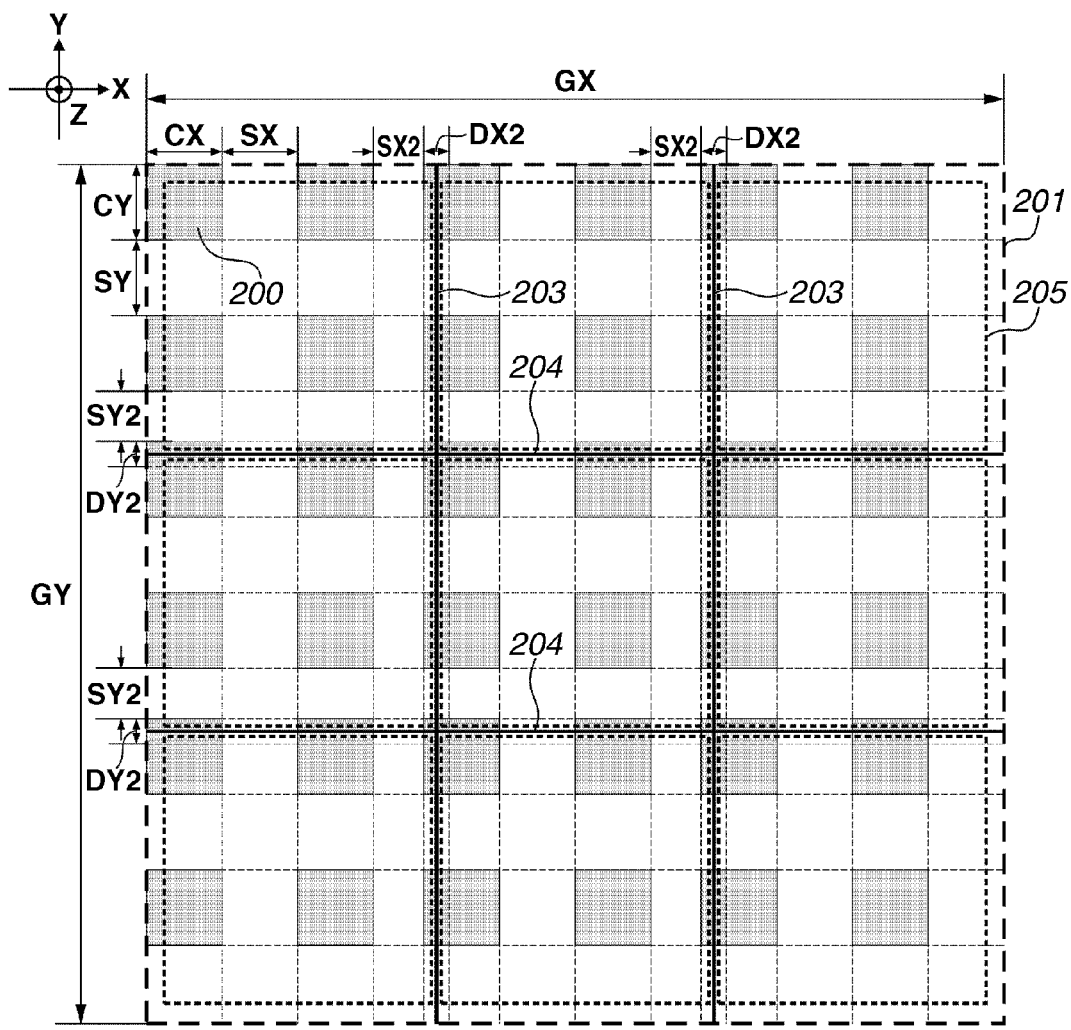
FIG. 2 is a diagram illustrating an arrangement example of sub arrays on a shot region formed on a substrate (a first exemplary embodiment).

FIG. 2 is a diagram illustrating an arrangement example of sub arrays (drawing regions by sub arrays) on a shot region previously formed on a substrate according to the present exemplary embodiment. The aperture array 116 described above converts an array of electron beams such that sub arrays are discretely arranged on the substrate 122 with a predetermined space therebetween. Drawing regions 200 by sub arrays (sub array drawing regions) each of which has a representative width CX in an X-axis direction and a representative width CY in a Y-axis direction are discretely arranged, in a lattice form, with a space having a width SX in the X-axis direction and a width SY in the Y-axis direction. Here, the X-axis direction and the Y-axis direction are two directions orthogonal to each other. However, the X-axis direction and the Y-axis direction need not necessarily be orthogonal to each other and may be two directions intersecting with each other. In each axis direction, the width (a nominal size; a third width) of the space is set to the width of an n multiple (n is a natural number or a positive integer, and n is one (1) in the present exemplary embodiment) of the width (a nominal size; a second width) of the sub array drawing region excluding at least one space, which will be described below. Here, drawing may be performed on a maximum shot region 201 (a maximum shot region of the drawing apparatus) having a width GX in the X-axis direction and a width GY in the Y-axis direction with a plurality of sub arrays.

In the maximum shot region 201, a shot region 205 previously formed on a substrate is arranged such that boundaries 203 and 204 thereof are arranged within ranges of a width DX2 and a width DY2, respectively. The width DX2 refers to the width in the X-axis direction from the left end of the sub array drawing region 200, and the width DY2 refers to the width in the Y-axis direction from the upper end of the sub array drawing region 200. The boundary 203 refers to the boundary in the X-axis direction of the shot region 205, and the boundary 204 refers to the boundary in the Y-axis direction of the shot region 205. Here, a width SX2 and a width SY2 of spaces (specific spaces) adjacent to the ranges of the boundaries DX2 and DY2, respectively, are smaller than the width SX and the width SY of the remaining spaces, respectively. The width SX2 is set to the width of (SX−DX2), and the width SY2 is set to the width of (SY−DY2).

FIG. 2 illustrates an example in which the width SX is equal to the width CX, the width SY is equal to the width CY, and nine (=3×3) shot regions 205 previously formed on the substrate are included in the maximum shot region 201 of the drawing apparatus as a simple configuration. Here, it is difficult to easily change an array of sub arrays since an array of sub arrays is defined by the structure of the aperture array 116 of the projection system COS. The shot region 205 previously formed on the substrate includes one or more chip regions. Since the size of a chip is a parameter having influence on productivity, there is also a need for a desire to set the size of a chip to be as small as possible and set the size of a chip in proportion to the desirable circuit size. For this reason, as the above-described sub array arrangement is made on the shot region 205 defined as described above, it is possible to cope with the shot region 205 having the size within the range from an n multiple of the size of the sub array drawing region to the size smaller than the size of the n multiple by the width DX2 (the width DY2). However, this reduces a restriction of a degree of freedom of the chip size. In terms of a degree of freedom, it is desirable to increase the width DX2 and the width DY2. However, in this case, when it is considered that many electron beams which are unlikely to be used in drawing are generated (redundant electron beams are increased), it is desirable to reduce the width DX2 and the width DY2. Thus, for example, it is desirable that a range of the size of a target shot region 205 be set, the width DX2 and the width DY2 be defined based on the range, and the size (the width CX and the width CY) of the sub array drawing region be defined based on the maximum size of the shot region 205. The width DX2 (DY2) may be set to a predetermined width smaller than the width (the second width) of the sub array drawing region.

Further, when the maximum shot region 201 of the drawing apparatus includes only two or less shot regions 205 in a certain axis direction, the shot regions 205 may be arranged such that the boundary 203 (204) of the shot region matches the boundary of the sub array drawing region 200 in the certain axis direction. When this case is usual, all spaces present in the certain axis direction may be set to have the same width.

In the description of the exemplary embodiment, various kinds of sizes or dimensions are assumed to be nominal values (or designed values) unless it is explicitly stated otherwise. Further, in the description of the exemplary embodiment, a mathematical expression (a character expression) is assumed to represent a relation between nominal values.

Figure 3:
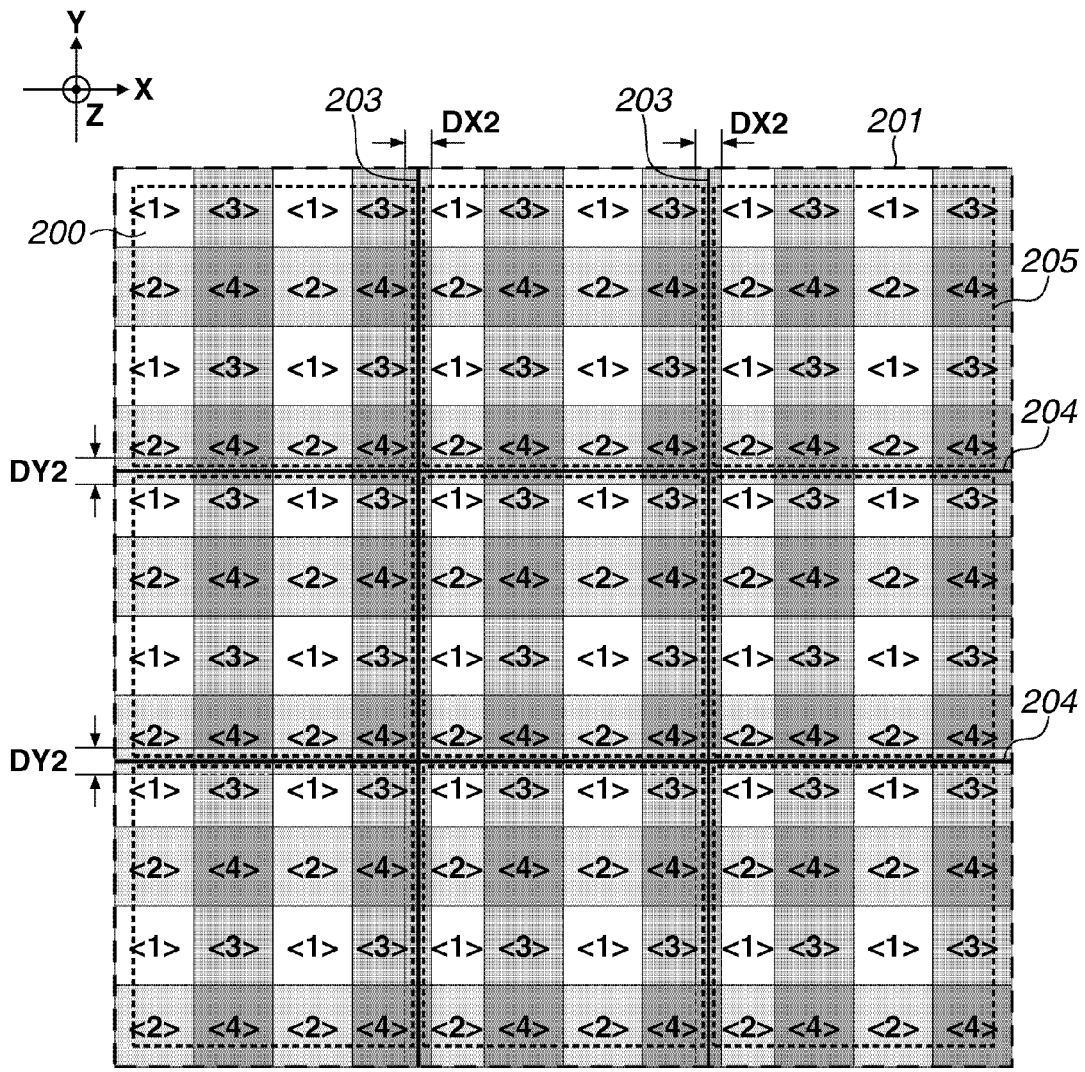
FIG. 3 is a diagram illustrating a plurality of sets of drawing regions which are sequentially subjected to drawing in one shot region of a drawing apparatus.

Next, a method of performing drawing on the shot region of the drawing apparatus with the sub array arrangement illustrated in FIG. 2 will be described. FIG. 3 is a diagram illustrating a plurality of sets of drawing regions which are sequentially subjected to drawing in one shot region of the drawing apparatus. In FIG. 3, one of symbols <1> to <4> is assigned to a drawing region of each sub array, and the same symbol is assigned to drawing regions which are subjected to drawing concurrently. Drawing is performed on each sub array drawing region according to a drawing method which will be described below. Here, when the shot region 205 previously formed on the substrate and each sub array have the position relation illustrated in FIG. 2 in an initial state (a state when drawing starts), drawing is first performed on a set <1> of drawing regions indicated by <1>. At this time, for the sub array drawing region straddling the boundary 203 (204) of the shot region 205, drawing is performed only on a region at the right end (lower end) side further than the boundary 203 (204) based on information necessary for overlaying such as an alignment measurement result on the corresponding shot region 205. A region at the left end (upper end) side further than the boundary 203 (204) is not subjected to drawing. A region between the maximum shot region 201 of the drawing apparatus and the outer edge of all the shot regions 205 arranged in the maximum shot region 201 is not subjected to drawing. The sub array drawing region that does not straddle the boundary 203 (204) is subjected to drawing based on information necessary for overlaying such as an alignment measurement result on the shot region 205 included in the sub array drawing region. Further, when the boundary 203 or 204 is arranged to match the boundary of the sub array drawing region 200 as described above, there is no sub array drawing region straddling a plurality of shot regions in the corresponding axis direction.

Subsequently, the stage unit 123 is moved by the distance CY in the Y-axis direction in a step manner, and then drawing is performed on a set of drawing regions indicated by <2>, similarly to the set <1> of drawing regions. In other words, for the sub array drawing region straddling the boundary 203 (204) of the shot region 205, drawing is performed only on a region at the right end (lower end) side further than the boundary 203 (204) based on information necessary for overlaying such as an alignment measurement result on the corresponding shot region 205. A region at the left end (upper end) side further than the boundary 203 (204) is not subjected to drawing. A region between the maximum shot region 201 of the drawing apparatus and the outer edge of all the shot regions 205 arranged in the maximum shot region 201 is not subjected to drawing. The sub array drawing region that does not straddle the boundary 203 (204) is subjected to drawing based on information necessary for overlaying such as an alignment measurement result on the shot region 205 included in the sub array drawing region. Then, drawing is performed on a set <3> of drawing regions and a set <4> of drawing regions, respectively, obtained by moving the stage unit 123 from the set <1> of drawing regions and the set <2> of drawing regions by the distance CX in the X-axis direction in a step manner, similarly to the set <1> of drawing regions and the set <2> of drawing regions. As a result, drawing on the shot regions 205 (the nine shot regions 205) in the maximum shot region 201 of the drawing apparatus is completed. In terms of the throughput, it is desirable to perform drawing on the sets <1> to <4> of drawing regions in ascending order of the numbers, but drawing on the sets <1> to <4> of drawing regions needs not be necessarily performed in this order.

Figure 4:
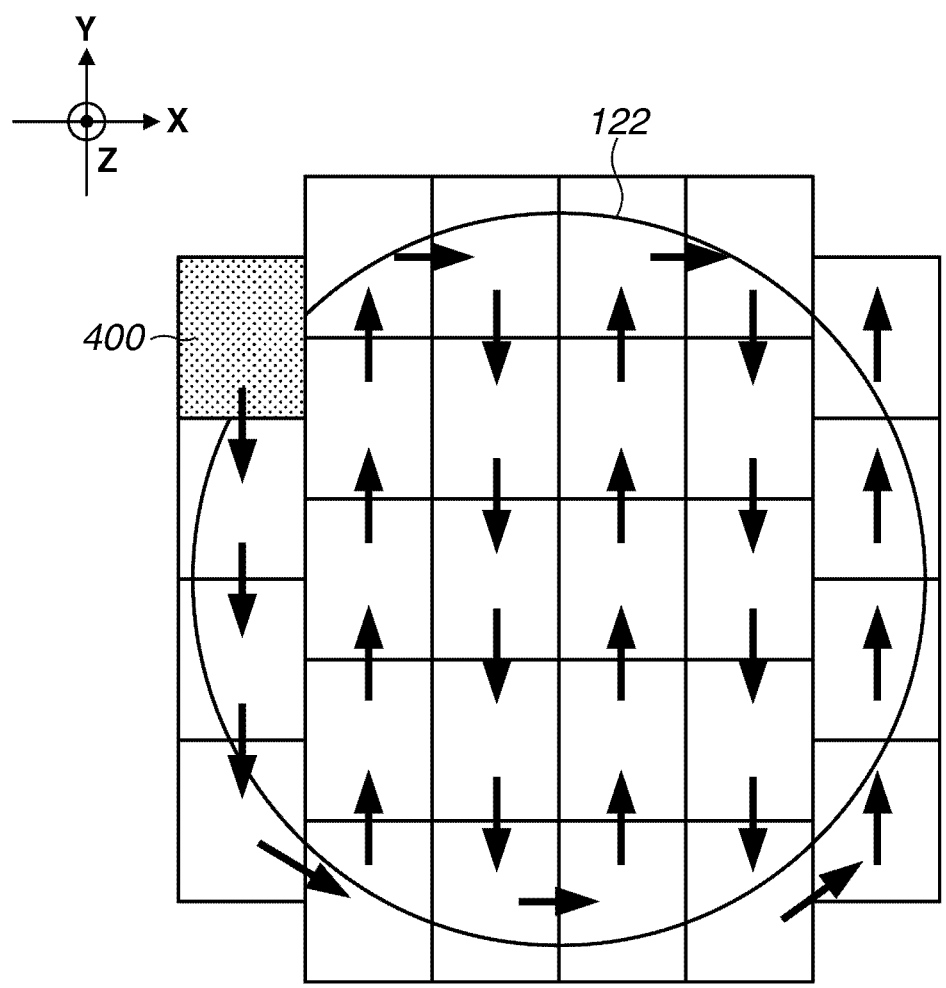
FIG. 4 is a diagram illustrating an order in which a drawing apparatus performs drawing on a plurality of shot regions of the drawing apparatus.

FIG. 4 is a diagram illustrating an order in which the drawing apparatus performs drawing on a plurality of shot regions of the drawing apparatus. As described above with reference to FIGS. 2 and 3, drawing is performed on a plurality of shot regions 205 included in the maximum shot region 201 of the drawing apparatus having the width GX in the X-axis direction and the width GY in the Y-axis direction. The entire region of a set of a plurality of shot regions 205 which have been subjected to drawing is referred to as a shot region 400 of the drawing apparatus. The shot regions 400 of the drawing apparatus are arrayed on the substrate 122 as illustrated in FIG. 4. The drawing apparatus moves the stage unit 123 in a step manner each time drawing of the shot region 400 finishes, and sequentially performs drawing on a plurality of shot regions 400 in an order indicated by arrows in FIG. 4.

Figure 5:
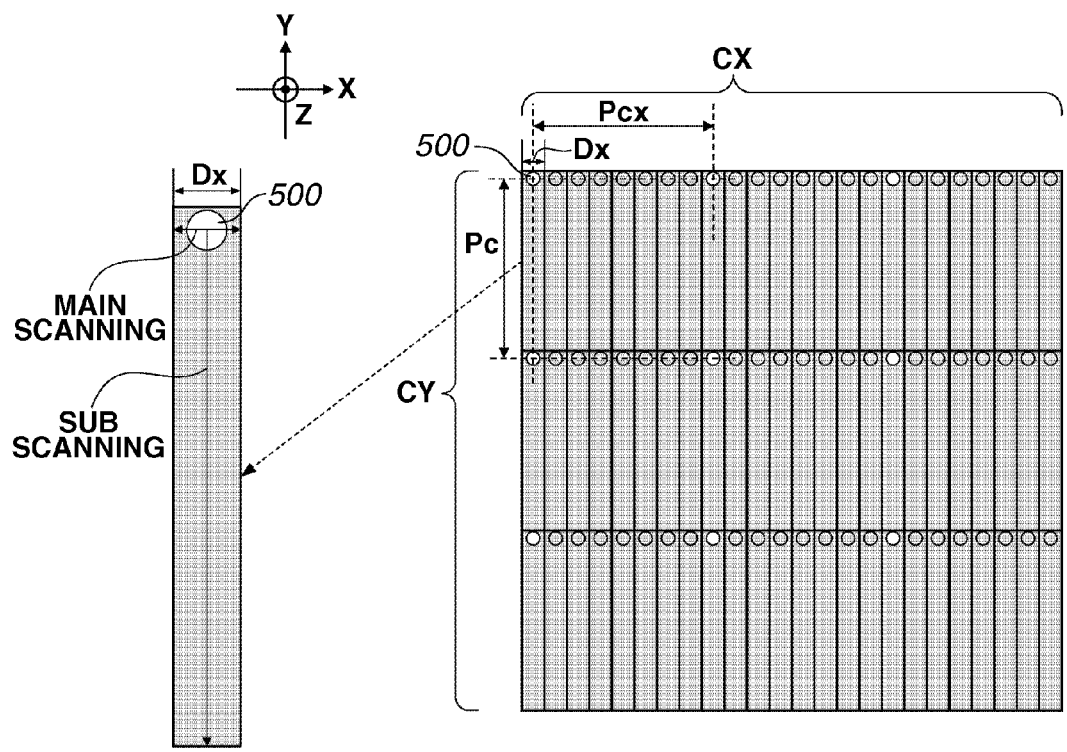
FIG. 5 is a diagram illustrating an example (a rectangular lattice arrangement) of a beam array in a sub array and a drawing form by the beam array.

FIG. 5 is a diagram illustrating an example (a square lattice arrangement or a rectangular array) of a beam array in a sub array on the substrate 122 and a drawing form by the beam array. Charged particle beams 500 are arrayed in a rectangular lattice form in which the charged particle beams 500 are arranged on the substrate 122 at a pitch Pcx in the X-axis direction and at a pitch Pc in the Y-axis direction. FIG. 5 illustrates an example of a sub array configured with electron beams of three rows by three columns. However, the number of rows and the number of columns of the electron beam are not limited to this example.

Here, drawing in the X-axis direction using a plurality of electron beams (sub arrays) arrayed as described above is performed mainly by deflection (raster scanning having a width Dx; main scanning) of the electron beams by the deflector array 120. Further, drawing in the Y-axis direction is performed mainly by movement (scanning having the width Pc; sub scanning) of the stage unit 123. It is desirable that the width Dx be set to a value equal to less than a deflection width of the deflector array 120. Thus, a process of dividing a region of the width Dx twice or more and sequentially performing drawing is unnecessary, and thus the number of times of movement (sub scanning) of the stage in the Y-axis direction is reduced (the throughput is improved). A region corresponding to the pitch Pcx of the X-axis direction is sequentially subjected to drawing in units of regions having the width Dx through stepping movement of the stage unit 123 corresponding to the width Dx. It is desirable that the pitch Pcx be set to a natural-number multiple of the width Dx. However, the pitch Pcx is not limited to this example. For example, the deflection width of the electron beams by the deflector array 120 may be set to be larger than the width Dx, and drawing may be performed in such a way that boundary regions overlap each other. In this case, by giving a gradient to a dose amount in each drawing on the overlap region, a connection error can be reduced. Here, when a sub array of a rectangular lattice arrangement is used as in the present exemplary embodiment, a drawing region of each sub array has a rectangular boundary.

According to the present exemplary embodiment, individual shot regions can be efficiently drawn based on information necessary for overlaying on individual shot regions without performing drawing on a region at one side of the boundary of the shot region and a region at the other side with one sub array concurrently.

Figure 6:
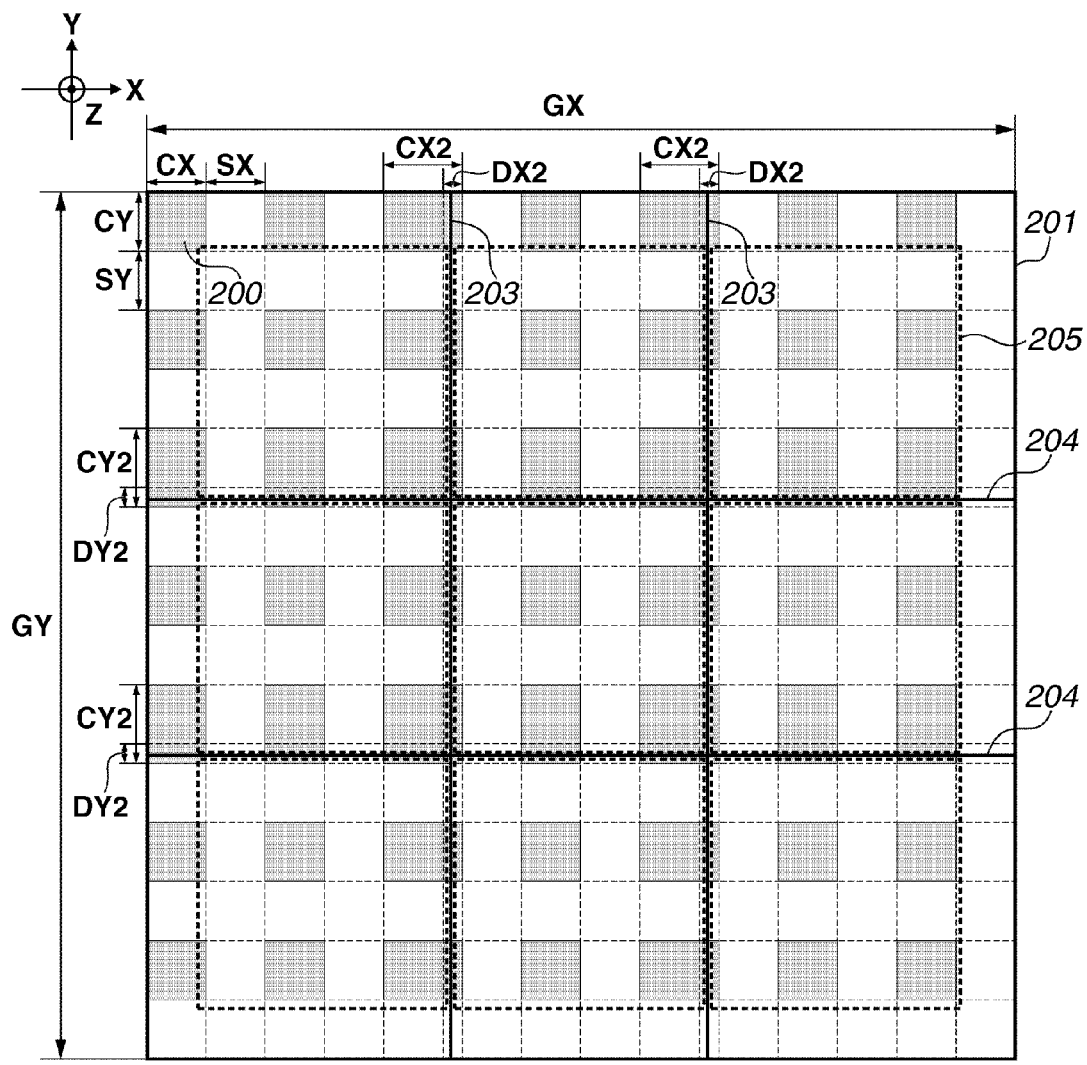
FIG. 6 is a diagram illustrating an arrangement example of sub arrays on a shot region formed on a substrate (a second exemplary embodiment).

FIG. 6 is a diagram illustrating an arrangement example of sub arrays (drawing regions by sub arrays) on a shot region previously formed on a substrate according to a second exemplary embodiment. A difference from the configuration (FIG. 2) of the first exemplary embodiment will be described. In the first exemplary embodiment, for example, some of the widths SY of the space between the sub array drawing regions in the Y-axis direction are reduced to have the width SY2. On the other hand, in the second exemplary embodiment, the width SY of the space does not change, and some of the widths CY in the Y-axis direction of the sub array drawing region are enlarged to have a width CY2. In each axis direction, the width (a nominal size; a third width) of a space is set to the width of an n multiple (n is a positive integer, and n is one (1) in the present exemplary embodiment) of the width (a nominal size; a second width) of a drawing region 200 by the sub array excluding at least one sub array which will be described below. Here, drawing may be performed on a maximum shot region 201 having a width GX in the X-axis direction and a width GY in the Y-axis direction with a plurality of sub arrays. In the maximum shot region 201, a shot region 205 previously formed on a substrate is arranged such that boundaries 203 and 204 thereof are arranged within ranges of a width DX2 and a width DY2, respectively. The width DX2 refers to the width in the X-axis direction from the right end of the sub array drawing region 200 (a drawing region of a specific sub array), and the width DY2 refers to the width in the Y-axis direction from the lower end of the sub array drawing region 200 (a drawing region of a specific sub array). Here, a width CX2 and a width CY2 of the sub array drawing regions, respectively, included in the ranges of the boundaries DX2 and DY2 are larger than the width CX and the width CY of the remaining sub array drawing regions, respectively. The width CX2 is set to the width of (CX+DX2), and the width CY2 is set to the width of (CY+DY2). FIG. 6 illustrates an example in which the width SX is equal to the width CX, the width SY is equal to the width CY, and nine (=3×3) shot regions 205 previously formed on the substrate are included in the maximum shot region 201 of the drawing apparatus as a simple configuration.

Further, when the maximum shot region 201 of the drawing apparatus includes only two or less shot regions 205 in a certain axis direction, the shot regions 205 may be arranged such that the boundary 203 (204) of the shot region matches the boundary of the sub array drawing region 200 in the corresponding axis direction. When this case is usual, all sub array drawing regions present in the certain axis direction may be set to have the same width.

Figure 7:
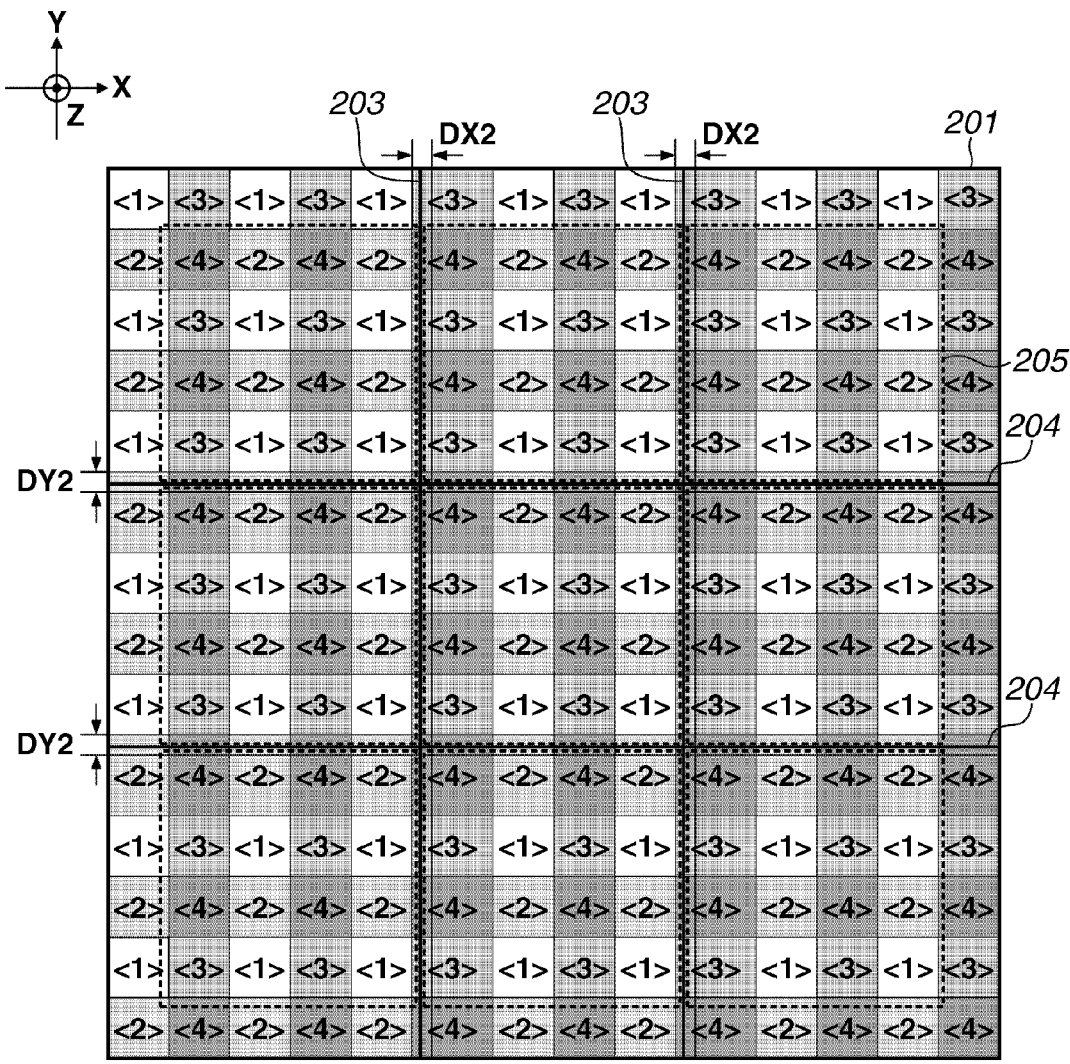
FIG. 7 is a diagram illustrating a plurality of sets of drawing regions which are sequentially subjected to drawing in one shot region of a drawing apparatus.

FIG. 7 is a diagram illustrating a plurality of sets of drawing regions which are sequentially subjected to drawing in one shot region of the drawing apparatus. In FIG. 7, one of symbols <1> to <4> is assigned to a drawing region of each sub array, and the same symbol is assigned to drawing regions which are subjected to drawing concurrently. Drawing is performed on each sub array drawing region according to a drawing method which will be described below. Here, when the shot region 205 previously formed on the substrate and each sub array have the position relation illustrated in FIG. 6 in an initial state (a state when drawing starts), drawing is first performed on a set <1> of drawing regions indicated by <1>. At this time, for the sub array drawing region straddling the boundary 203 (204) of the shot region 205, drawing is performed only on a region at the left end (upper end) side further than the boundary 203 (204) based on information necessary for overlaying such as an alignment measurement result on the corresponding shot region 205. A region at the right end (lower end) side further than the boundary 203 (204) is not subjected to drawing. A region between the maximum shot region 201 of the drawing apparatus and the outer edge of all the shot regions 205 arranged in the maximum shot region 201 is not subjected to drawing. The sub array drawing region that does not straddle the boundary 203 (204) is subjected to drawing based on information necessary for overlaying such as an alignment measurement result on the shot region 205 included in the sub array drawing region. Further, when the boundary 203 or 204 is arranged to match the boundary of the sub array drawing region 200 as described above, there is no sub array drawing region straddling a plurality of shot regions in the corresponding axis direction.

Subsequently, the stage unit 123 is moved by the distance CY in the Y-axis direction in a step manner, and then drawing is performed on a set of drawing regions indicated by <2>, similarly to the set <1> of drawing regions. In other words, for the sub array drawing region straddling the boundary 203 (204) of the shot region 205, drawing is performed only on a region at the left end (upper end) side further than the boundary 203 (204) based on information necessary for overlaying such as an alignment measurement result on the corresponding shot region 205. A region at the right end (lower end) side further than the boundary 203 (204) is not subjected to drawing. A region between the maximum shot region 201 of the drawing apparatus and the outer edge of all the shot regions 205 arranged in the maximum shot region 201 is not subjected to drawing. The sub array drawing region that does not straddle the boundary 203 (204) is subjected to drawing based on information necessary for overlaying such as an alignment measurement result on the shot region 205 included in the sub array drawing region. Then, drawing is performed on a set <3> of drawing regions and a set <4> of drawing regions, respectively, obtained by moving the stage unit 123 from the set <1> of drawing regions and the set <2> of drawing regions by the distance CX in the X-axis direction in a step manner, similarly to the set <1> of drawing regions and the set <2> of drawing regions. As a result, drawing on the shot regions 205 (the nine shot regions 205) in the maximum shot region 201 of the drawing apparatus is completed. In terms of the throughput, it is desirable to perform drawing on the sets <1> to <4> of drawing regions in ascending order of the numbers, but drawing on the sets <1> to <4> of drawing regions needs not be necessarily performed in this order.

According to the present exemplary embodiment, individual shot regions can be efficiently drawn based on information necessary for overlaying on individual shot regions without performing drawing on a region at one side of the boundary of the shot region and a region at the other side with one sub array concurrently.

Figure 8:
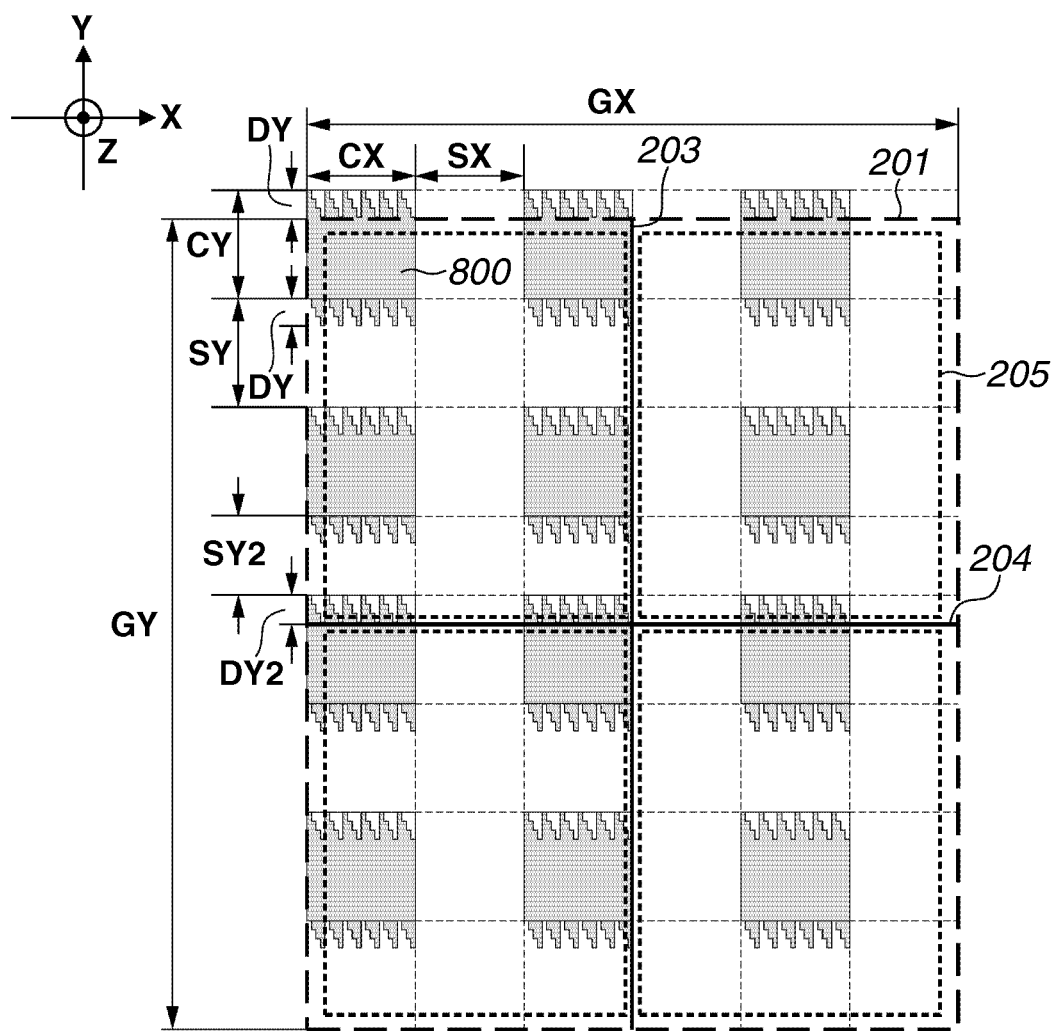
FIG. 8 is a diagram illustrating an arrangement example of sub arrays on a shot region formed on a substrate (a third exemplary embodiment).

FIG. 8 is a diagram illustrating an arrangement example of sub arrays (drawing regions by sub arrays) on a shot region previously formed on a substrate according to a third exemplary embodiment. A difference from the configuration of the first exemplary embodiment will be described. In the first exemplary embodiment (FIG. 2), the sub array drawing region has a rectangular shape. On the other hand, in the third exemplary embodiment, the sub array drawing region has a non-rectangular shape having a concavo-convex portion at the outer edge thereof. An issue when the sub array drawing region has a non-rectangular shape and a solution thereto will be described below.

In the present exemplary embodiment, the aperture array 116 converts an array of electron beams such that drawing regions 800 by sub arrays (sub array drawing regions) are discretely arranged on the substrate 122 with a predetermined space therebetween. The sub array drawing region 800 has a non-rectangular shape in which the outer edge has the concavo-convex portion over a width DY in the Y-axis direction. The sub array drawing region 800 has a representative width CX in the X-axis direction and a representative width CY in the Y-axis direction. The sub array drawing regions 800 are discretely arranged, in a lattice form, with a space having a width SX in the X-axis direction and a width SY in the Y-axis direction. In each axial direction, the width (a nominal size; a third width) of the space is set to the width of an n multiple (n is a positive integer, and n is one (1) in the present exemplary embodiment) of the width (a nominal size; a second width) of the sub array drawing region 800 excluding at least one space which will be described below. Here, drawing may be performed on a maximum shot region 201 having a width GX in the X-axis direction and a width GY in the Y-axis direction with a plurality of sub arrays. In the X-axis direction in which there is no concavo-convex portion in the boundary of the sub array drawing region 800, the shot regions 205 (the substrate 122) are arranged such that the boundary 203 of the shot region 205 previously formed on the substrate matches the boundary of the sub array drawing region 800. In the Y-axis direction in which there is a concavo-convex in the boundary of the sub array drawing region 800, the shot regions 205 are arranged such that the boundary 204 of the shot region 205 is positioned nearer the lower end of the sub array drawing region 800 by a width DY2 (DY2≧DY) from the upper end of the sub array drawing region 800. Further, a width SY2 of space (a specific space), in the Y-axis direction, which is adjacent to the boundary 204 of the shot region 205 is set to a width (SY2=SY−DY2) smaller than the width SY of the remaining spaces in the Y-axis direction.

Here, when a beam array in a sub array is a checkerboard lattice arrangement as will be described below with reference to FIG. 10, a representative width Pc of a checkerboard lattice block (which will be described below) in the Y-axis direction may be used as the width DY2. However, it is desirable that Pc−Pcy (=DY; a first width) which is the width of the concavo-convex portion in the Y-axis direction be used as the width DY2 (waste is minimum). The width DY2 may be set to the first width or more and to the second width or less. FIG. 8 illustrates a position relation between the sub array drawing region 800 and the boundaries 203 and 204 of the shot region when the width SX is equal to the width CX, the width SY is equal to the width CY, and four (=2×2) shot regions 205 are included in the maximum shot region 201 as a simple configuration. In the case of the sub array drawing region 200 having a rectangular shape as in the first exemplary embodiment, when the maximum shot region 201 includes two or less shot regions 205 in a certain axis direction, it is desirable to perform the following. In other words, it is desirable that the shot regions 205 be arranged such that the boundary of the shot region 205 matches the boundary of the sub array drawing region in the certain axis direction. However, when the sub array drawing region has the concavo-convex boundary as in the present exemplary embodiment, the shot region 205 has a rectangular shape and thus, it is difficult to match the boundary of the sub array drawing region with the boundary of the shot region 205. In this regard, it is desirable to employ an arrangement of the present exemplary embodiment for an axis in which the sub array drawing region has the concavo-convex the boundary. Further, when the maximum shot region 201 includes three or more shot regions 205 in a certain axis direction, it is desirable to employ an arrangement of sub arrays to which methods (forms) of both the present exemplary embodiment and the first exemplary embodiment are applied.

Figure 9:
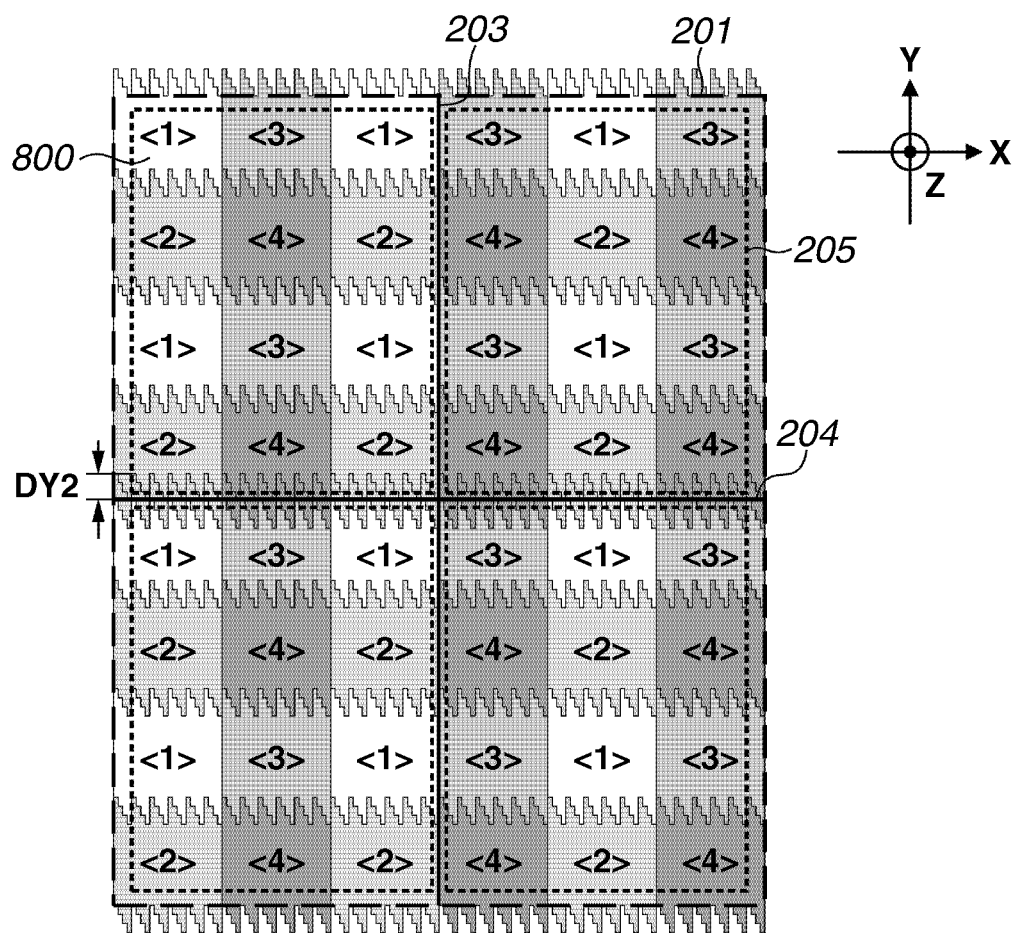
FIG. 9 is a diagram illustrating a plurality of sets of drawing regions which are sequentially subjected to drawing in one shot region of a drawing apparatus.

FIG. 9 is a diagram illustrating a plurality of sets of drawing regions which are sequentially subjected to drawing in one shot region of the drawing apparatus. In FIG. 9, one of symbols <1> to <4> is assigned to a drawing region of each sub array, and the same symbol is assigned to drawing regions which are subjected to drawing concurrently. Drawing is performed on each sub array drawing region according to a drawing method which will be described below. Here, when the shot region 205 previously formed on the substrate and each sub array have the position relation illustrated in FIG. 8 in an initial state (a state when drawing starts), drawing is first performed on a set <1> of drawing regions indicated by <1>. At this time, for the sub array drawing region straddling the boundary 204 of the shot region 205, drawing is performed only on a region at the lower end side further than the boundary 204 based on information necessary for overlaying such as an alignment measurement result on the corresponding shot region 205. A region at the upper end side further than the boundary 204 is not subjected to drawing. A region between the maximum shot region 201 of the drawing apparatus and the outer edge of all the shot regions 205 arranged in the maximum shot region 201 is not subjected to drawing. The sub array drawing region that does not straddle the boundary 204 is subjected to drawing based on information necessary for overlaying such as an alignment measurement result on the shot region 205 included in the sub array drawing region. Further, in the X-axis direction, since the boundary 203 is arranged to match the boundary of the sub array drawing region 800 as described above, there is no sub array drawing region straddling a plurality of shot regions.

Subsequently, the stage unit 123 is moved by the distance CY in the Y-axis direction in a step manner, and then drawing is performed on a set of drawing regions indicated by <2>. In other words, similarly to the set <1> of drawing regions, for the sub array drawing region straddling the boundary 204 of the shot region 205, drawing is performed only on a region at the lower end side further than the boundary 204 based on information necessary for overlaying such as an alignment measurement result on the corresponding shot region 205. A region at the upper end side further than the boundary 204 is not subjected to drawing. A region between the maximum shot region 201 of the drawing apparatus and the outer edge of all the shot regions 205 arranged in the maximum shot region 201 is not subjected to drawing. The sub array drawing region that does not straddle the boundary 204 is subjected to drawing based on information necessary for overlaying such as an alignment measurement result on the shot region 205 included in the sub array drawing region. Then, drawing is performed on a set <3> of drawing regions and a set <4> of drawing regions, respectively, obtained by moving the stage unit 123 from the set <1> of drawing regions and the set <2> of drawing regions by the distance CX in the X-axis direction in a step manner, similarly to the set <1> of drawing regions and the set <2> of drawing regions. As a result, drawing on the shot regions 205 (the four shot regions 205) in the maximum shot region 201 of the drawing apparatus is completed. In terms of a throughput, it is desirable to perform drawing on the sets <1> to <4> of drawing regions in ascending order of the numbers, but drawing on the sets <1> to <4> of drawing regions needs not be necessarily performed in this order.

Figure 10:
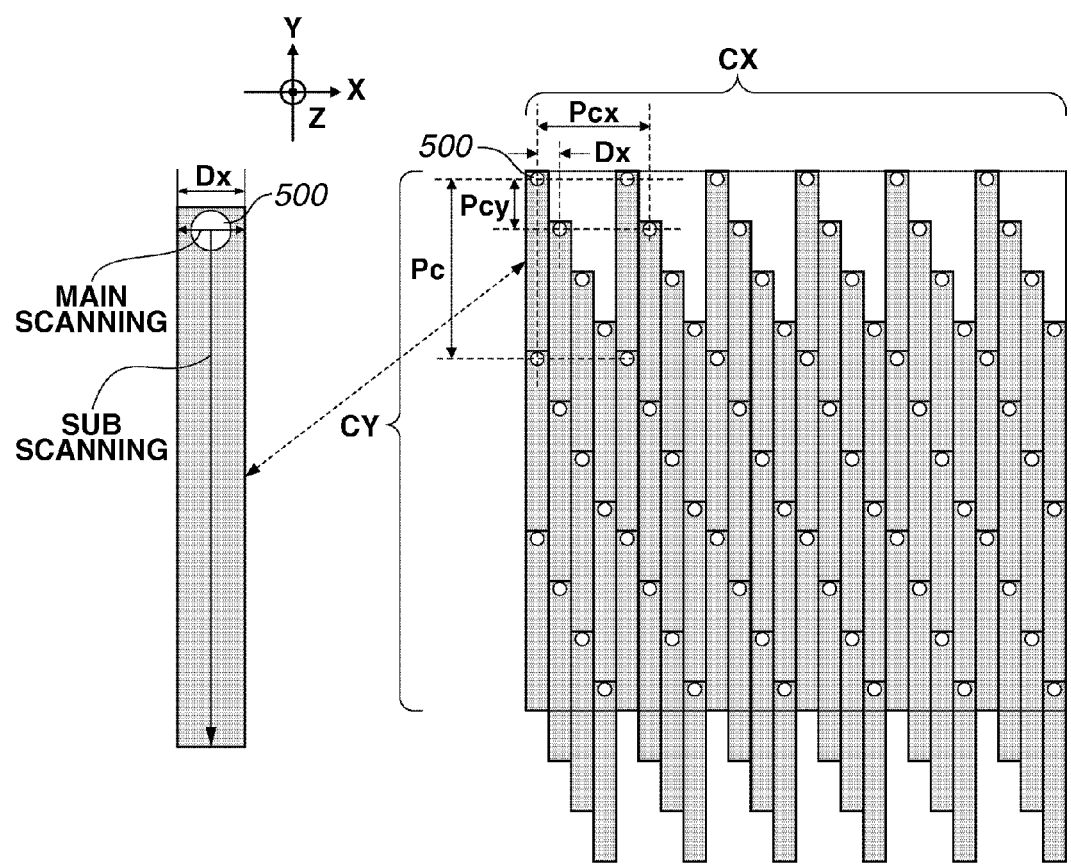
FIG. 10 is a diagram illustrating an example (checkerboard lattice arrangement) of a beam array in a sub array and a drawing form by the beam array.

FIG. 10 is a diagram illustrating an example (a checkerboard lattice arrangement) of a beam array in a sub array and a drawing form by the beam array. The difference from the first and second exemplary embodiments will be described. Charged particle beams 500 are arrayed in a checkerboard lattice form in which the charged particle beams 500 are arranged at a pitch Pcx in the X-axis direction and at a pitch Pcy in the Y-axis direction, and the electron beams of two neighboring rows apart from each other by the pitch Pcy in the Y-axis direction deviate from each other by a distance Dx in the X-axis direction. In other words, the charged particle beams 500 are arrayed in a form obtained by sequentially shifting an array (row) of electron beam extending in the X-axis direction by the pitch Pcy in the Y-axis direction and the distance Dx in the X-axis direction. It is desirable that a distance of a (1/k) multiple of the pitch Pcx (k is an integer of two or more) be selected as the distance Dx. In this case, the position of electron beam in one row is repeated with a period of (Pcx/Dx) rows. Here, in the present exemplary embodiment, when a bundle of electron beams having the width Pc in the Y-axis direction corresponding to one period is referred to as one checkerboard lattice block, one sub array is configured with a plurality of steps of checkerboard lattice blocks arranged in the Y-axis direction. FIG. 10 illustrates an example in which one checkerboard lattice block is configured with four rows of electron beams, and a sub array is configured with three steps of checkerboard lattice blocks. The number of rows of electron beams configuring the checkerboard lattice block and the number of steps of checkerboard lattice blocks constituting a sub array are not limited to this example. In the sub array, an array of charged particle beams each of which has a predetermined width (a first width Pc) from each end in the Y-axis direction is complementary to each other.

Here, drawing in the X-axis direction using a plurality of electron beams (sub arrays) arrayed as described above is performed mainly by deflection (raster scanning having a width Dx; main scanning) of the electron beams by the deflector array 120. Further, drawing in the Y-axis direction is performed mainly by movement (scanning having the width Pc; sub scanning) of the stage unit 123. It is desirable that the width Dx be set to a value equal to or less than a deflection width of the deflector array 120. Thus, a process of dividing a region of the width Dx twice or more and sequentially performing drawing is unnecessary, and thus the number of times of movement (sub scanning) of the stage in the Y-axis direction is reduced (the throughput is improved). It is desirable that the pitch Pcx be set to a natural-number multiple of the width Dx. However, the pitch Pcx is not limited to this example. For example, the deflection width of the electron beams by the deflector array 120 may be set to be larger than the width Dx, and drawing may be performed in such a way that boundary regions overlap each other. In this case, by giving a gradient to a dose amount in each drawing on the overlap region, a connection error can be reduced.

In the case of the sub array of the checkerboard lattice arrangement as in the present exemplary embodiment, the boundary of the drawing region by each sub array in the Y-axis direction has a sawtooth shape corresponding to one checkerboard lattice block. The X-axis direction is used as the main scanning direction, and the Y-axis direction is used as the sub scanning direction. However, the Y-axis direction may be used as the main scanning direction, and the X-axis direction may be used as the sub scanning direction.

According to the present exemplary embodiment, it is possible to provide the drawing apparatus configured to be capable of efficiently using charged particle beams of sub arrays. A main difference from the drawing apparatus using the beam array (the rectangular lattice arrangement) illustrated in FIG. 5 in the first exemplary embodiment is a drawing method in the sub array drawing region. In the rectangular lattice arrangement of the first exemplary embodiment, the region having the width Pcx in the main scanning direction is divided into a plurality of regions having the width Dx, and drawing is sequentially performed on the plurality of regions. Thus, movement (sub scanning) of the stage of many times (Pcx/Dx times) is necessary. However, in the checkerboard lattice arrangement of the present exemplary embodiment, drawing can be performed on the region having Pcx in the main scanning direction by movement (sub scanning) of the stage of a small number of times (once). Thus, the throughput is improved. However, since the drawing region by the sub array has a non-rectangular shape, drawing is performed in a method described with reference to FIG. 8.

According to the present exemplary embodiment, individual shot regions can be efficiently drawn based on information necessary for overlaying on individual shot regions without performing drawing on a region at one side of the boundary of the shot region and a region at the other side with one sub array concurrently.

Figure 11:
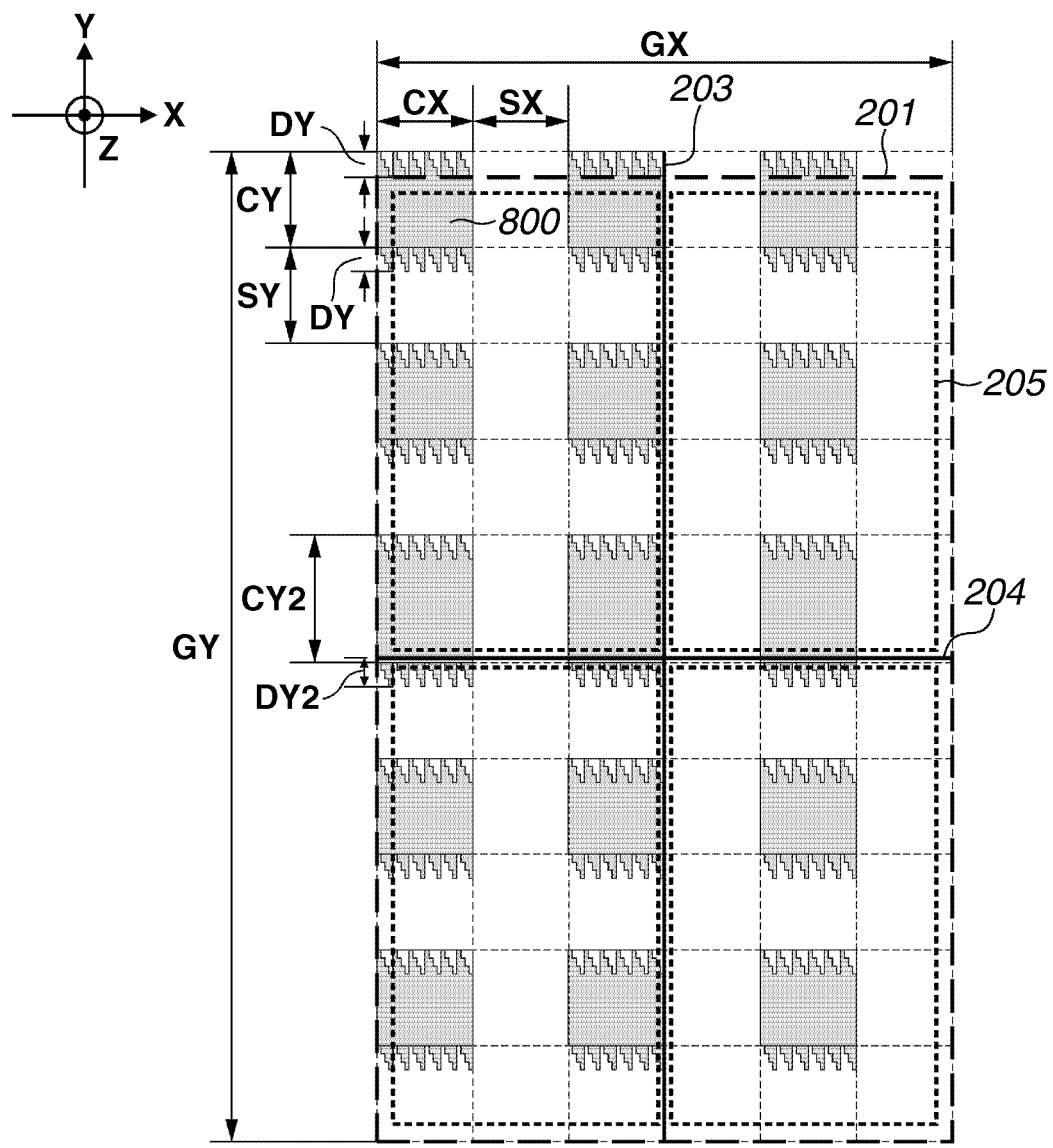
FIG. 11 is a diagram illustrating an arrangement example of sub arrays on a shot region formed on a substrate (a fourth exemplary embodiment).

FIG. 11 is a diagram illustrating an arrangement example of sub arrays (drawing regions by sub arrays) on a shot region previously formed on a substrate according to a fourth exemplary embodiment. A difference from the configuration of the third exemplary embodiment will be described.

In the third exemplary embodiment, some of the widths SY of the space between the sub array drawing regions in the Y-axis direction are reduced to have the width SY2. On the other hand, in the fourth exemplary embodiment, the width SY of the space does not change, and some of the widths CY in the Y-axis direction of the sub array drawing region are enlarged to have a width CY2. In each axis direction, the width (a nominal size; a third width) of a space is set to the width of a natural-number multiple (one (1) in the present exemplary embodiment) of the width (a nominal size; a second width) of a drawing region 200 by the sub array excluding at least one sub array which will be described below. Here, drawing may be performed on a maximum shot region 201 having a width GX in the X-axis direction and a width GY in the Y-axis direction with a plurality of sub arrays. In the X-axis direction in which there is no concavo-convex portion in the boundary of the sub array drawing region 800, the shot regions 205 (the substrate 122) are arranged such that the boundary 203 of the shot region 205 previously formed on the substrate matches the boundary of the sub array drawing region 800. In the Y-axis direction in which there is a concavo-convex in the boundary of the sub array drawing region 800, the following is performed. In other words, the shot regions 205 (the substrate 122) are arranged such that the boundary 204 of the shot region 205 previously formed on the substrate is positioned nearer the upper end of the sub array drawing region 800 by a width DY2 (DY2≧DY) from the lower end of the sub array drawing region 800. The width DY2 refers to the width in the Y-axis direction from the lower end of the sub array drawing region 800. Here, the width CY2 of the sub array drawing region (a drawing region of a certain sub array) including the range of the width DY2 is larger than the width CY of the remaining sub array drawing regions. The width CY2 is set to the width of (CY+DY2). Here, when the beam array in the sub array is the checkerboard lattice arrangement illustrated in FIG. 10, the representative width of the sub array drawing region in the Y-axis direction can be increased in units of checkerboard lattice blocks, and thus it is desirable that the representative width Pc of one checkerboard lattice block in the Y-axis direction be used as the width DY2. FIG. 11 illustrates an example in which the width SX is equal to the width CX, the width SY is equal to the width CY, and four (=2×2) shot regions 205 previously formed on the substrate are included in the maximum shot region 201 of the drawing apparatus as a simple configuration. Further, when the maximum shot region 201 includes three or more shot regions 205 in a certain axis direction, it is desirable to employ an arrangement of sub arrays to which methods (forms) of both the fourth exemplary embodiment and the second exemplary embodiment are applied.

Figure 12:
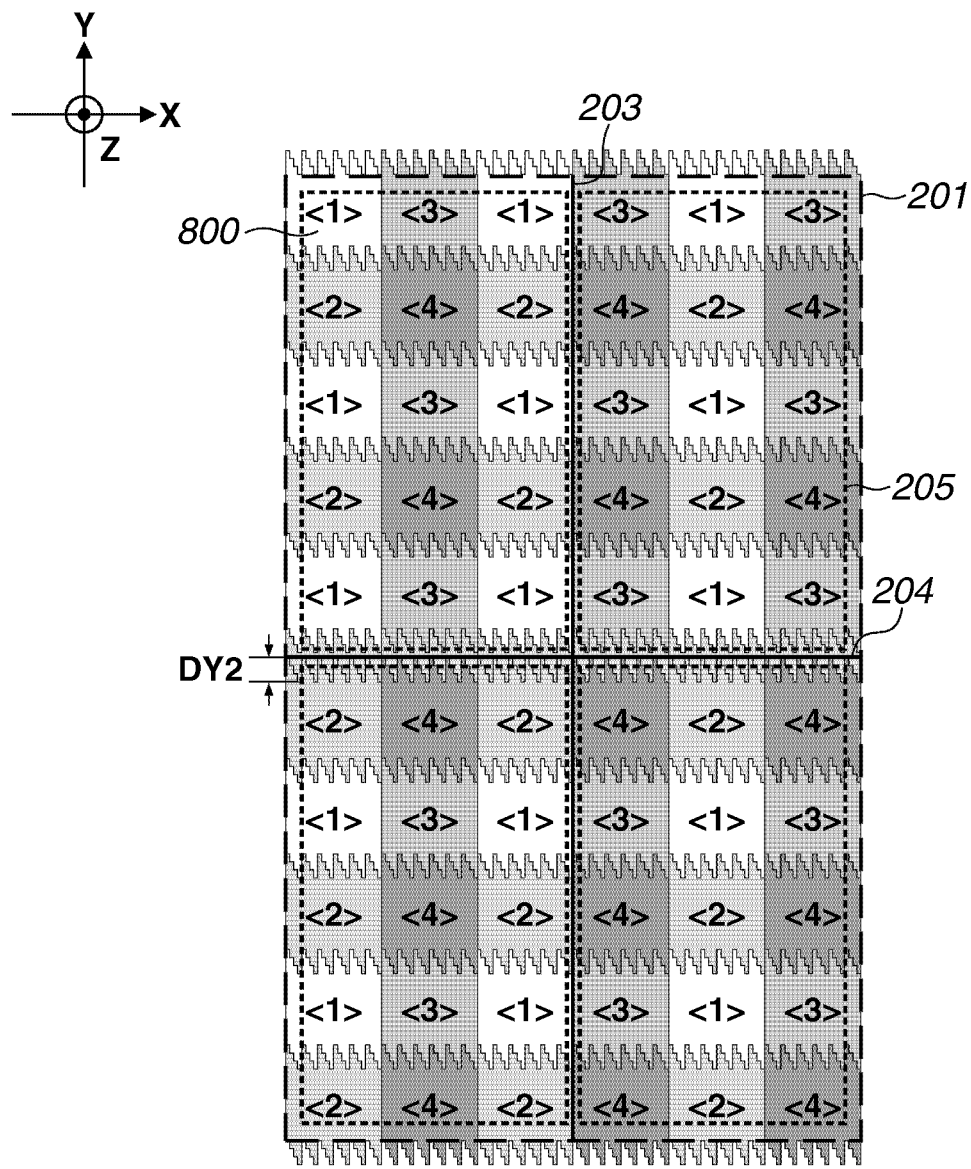
FIG. 12 is a diagram illustrating a plurality of sets of drawing regions which are sequentially subjected to drawing in one shot region of a drawing apparatus.

FIG. 12 is a diagram illustrating a plurality of sets of drawing regions which are sequentially subjected to drawing in one shot region of the drawing apparatus. In FIG. 12, one of symbols <1> to <4> is assigned to a drawing region of each sub array, and the same symbol is assigned to drawing regions which are subjected to drawing concurrently. Drawing is performed on each sub array drawing region according to a drawing method which will be described below. Here, when the shot region 205 previously formed on the substrate and each sub array have the position relation illustrated in FIG. 11 in an initial state (a state when drawing starts), drawing is first performed on a set <1> of drawing regions indicated by <1>. At this time, for the sub array drawing region straddling the boundary 204 of the shot region 205, drawing is performed only on a region at the upper end side further than the boundary 204 based on information necessary for overlaying such as an alignment measurement result on the corresponding shot region 205. A region at the lower end side further than the boundary 204 is not subjected to drawing. A region between the maximum shot region 201 of the drawing apparatus and the outer edge of all the shot regions 205 arranged in the maximum shot region 201 is not subjected to drawing. The sub array drawing region that does not straddle the boundary 204 is subjected to drawing based on information necessary for overlaying such as an alignment measurement result on the shot region 205 included in the sub array drawing region. Further, in the X-axis direction, since the boundary 203 of the shot region 205 is arranged to match the boundary of the sub array drawing region 800 as described above, there is no sub array drawing region straddling a plurality of shot regions.

Subsequently, the stage unit 123 is moved by the distance CY in the Y-axis direction in a step manner, and then drawing is performed on a set of drawing regions indicated by <2>. In other words, similarly to the set <1> of drawing regions, for the sub array drawing region straddling the boundary 204 of the shot region 205, drawing is performed only on a region at the upper end side further than the boundary 204 based on information necessary for overlaying such as an alignment measurement result on the corresponding shot region 205. A region at the lower end side further than the boundary 204 is not subjected to drawing. A region between the maximum shot region 201 of the drawing apparatus and the outer edge of all the shot regions 205 arranged in the maximum shot region 201 is not subjected to drawing. The sub array drawing region that does not straddle the boundary 204 is subjected to drawing based on information necessary for overlaying such as an alignment measurement result on the shot region 205 included in the sub array drawing region. Then, drawing is performed on a set <3> of drawing regions and a set <4> of drawing regions, respectively, obtained by moving the stage unit 123 from the set <1> of drawing regions and the set <2> of drawing regions by the distance CX in the X-axis direction in a step manner, similarly to the set <1> of drawing regions and the set <2> of drawing regions. As a result, drawing on the shot regions 205 (the four shot regions 205) in the maximum shot region 201 of the drawing apparatus is completed. In terms of a throughput, it is desirable to perform drawing on the sets <1> to <4> of drawing regions in ascending order of the numbers, but drawing on the sets <1> to <4> of drawing regions needs not be necessarily performed in this order.

According to the present exemplary embodiment, individual shot regions can be efficiently drawn based on information necessary for overlaying on individual shot regions without performing drawing on a region at one side of the boundary of the shot region and a region at the other side with one sub array concurrently.

A method of manufacturing an article according to an exemplary embodiment of the disclosure is suitable for manufacturing an article such as a micro device such as a semiconductor device or an element having a microstructure. The manufacturing method may include a process of forming a latent image pattern on a photosensitive material of a substrate coated with the photosensitive material using the drawing apparatus (a process of performing drawing on a substrate), and a process of developing the substrate on which the latent image pattern is formed by the above process. Further, the manufacturing method may include another known process (for example, oxidization, film forming, vapor deposition, doping, planarization, etching, resist separation, dicing, bonding, and packaging). The method of manufacturing the article according to the present exemplary embodiment is superior to the conventional method in at least one of performance, quality, productivity, and production cost of an article.

The above description has been made in connection with the exemplary embodiment in which drawing is concurrently performed on a plurality of shot regions previously formed on the substrate. However, the embodiment is not limited to this example, and can be applied to an example in which drawing is performed in a state in which a plurality of shot regions is not formed on the substrate yet. In this case, for example, instead of a plurality of shot regions previously formed on the substrate, a plurality of virtual nominal shot regions may be set (assumed) on the substrate, and drawing may be performed on the plurality of virtual nominal shot regions. In this case, it is desirable that for the sub array drawing region straddling the boundary of the shot region, drawing be performed only on a region at one side of the boundary based on information necessary for overlaying on the corresponding shot region. For example, in regard to an exposure device (drawing apparatus) configured to subsequently form a plurality of shot regions on a substrate, this drawing may be performed by previously acquiring information about the position or shape of a plurality of shot regions formed by the exposure device (drawing apparatus).

While the disclosure has been described with reference to exemplary embodiments, it is to be understood that the disclosure is not limited to the disclosed exemplary embodiments. The scope of the following claims is to be accorded the broadest interpretation so as to encompass all modifications, equivalent structures, and functions.

This application claims priority from Japanese Patent Application No. 2011-181578 filed Aug. 23, 2011, which is hereby incorporated by reference herein in its entirety.

What is claimed is:

1. A drawing apparatus which performs drawing, with a plurality of charged particle beams on a substrate, on which a first shot region and a second shot region are formed next to each other, the apparatus comprising:
    an aperture array configured to divide an incident charged particle beam into the plurality of charged particle beams including a first sub array in which a plurality of apertures are arrayed on a thin plate, a second sub array in which a plurality of apertures are arrayed on the thin plate, and a third sub array in which a plurality of apertures are arrayed on the thin plate;
    a blanking deflector array, in which a plurality of deflectors are arrayed, configured to deflect at least one of the plurality of charged particle beams divided by the aperture array;
    a stopping aperture array, in which a plurality of apertures are arrayed, configured to block the at least one deflected by the blanking deflector array;
    a deflector array in which a first deflector, which deflects a first plurality of charged particle beams divided by the first sub array, a second deflector, which deflects a second plurality of charged particle beams divided by the second sub array, and a third deflector, which deflects a third plurality of charged particle beams divided by the third sub array, are arrayed;
    a stage configured to hold the substrate;
    a driving device configured to drive the stage; and
    a controller configured to control the deflector array, the driving device, and the blanking deflector array, and perform blanking of the at least one by scanning, on the substrate, the first plurality of charged particle beams, the second plurality of charged particle beams, and the third plurality of charged particle beams,
    wherein, in order to reduce bending of the thin plate, in the aperture array, a spacer between the first sub array and the second sub array and a spacer between the second sub array and the third sub array are arranged,
    wherein a space between the second sub array and the third sub array is set narrower than a space between the first sub array and the second sub array, so that a first sub array drawing region, on which drawing with the first plurality of charged particle beams is performed, does not cross over a boundary between the first shot region and the second shot region, a second sub array drawing region, on which drawing with the second plurality of charged particle beams is performed, does not cross over the boundary, and a third sub array drawing region, on which drawing with the third plurality of charged particle beams is performed, crosses over the boundary, and,
    wherein the controller controls the deflector array, the driving device, and the blanking deflector array, so that, in parallel with the drawing on the first sub array drawing region being performed and the drawing on the second sub array drawing region being performed, drawing on the first shot region side of the boundary is not performed and drawing on the second shot region side of the boundary is performed on the third sub array drawing region.

2. The drawing apparatus according to claim 1,
    wherein the plurality of the apertures in the first sub array are arrayed in a rectangular lattice form,
    wherein the plurality of the apertures in the second sub array are arrayed in a rectangular lattice form, and
wherein the plurality of the apertures in the third sub array are arrayed in a rectangular lattice form.

3. The drawing apparatus according to claim 2,
wherein each of the first sub array drawing region, the second sub array drawing region, and the third sub array drawing region respectively has a same width of a drawing region,
wherein a space between the first sub array drawing region and the second sub array drawing region has a width of integral multiple of a positive number of the width of the drawing region, and
wherein a space between the second sub array drawing region and the third sub array drawing region is narrower than the width of integral multiple of a positive number of the width of the drawing region by a width less than the width of the drawing region.

4. A method to perform drawing using a drawing apparatus with a plurality of charged particle beams on a substrate, on which a first shot region and a second shot region are formed next to each other, the apparatus comprising: an aperture array configured to divide an incident charged particle beam into the plurality of charged particle beams including a first sub array in which a plurality of apertures are arrayed on a thin plate, a second sub array in which a plurality of apertures are arrayed on the thin plate, and a third sub array in which a plurality of apertures are arrayed on the thin plate; a blanking deflector array, in which a plurality of deflectors are arrayed, configured to deflect at least one of the plurality of charged particle beams divided by the aperture array; a stopping aperture array, in which a plurality of apertures are arrayed, configured to block the at least one deflected by the blanking deflector array; a deflector array in which a first deflector, which deflects a first plurality of charged particle beams divided by the first sub array, a second deflector, which deflects a second plurality of charged particle beams divided by the second sub array, and a third deflector, which deflects a third plurality of charged particle beams divided by the third sub array, are arrayed, the method comprising:

holding the substrate using a stage;
driving the stage; and
controlling the deflector array, the driving device, and the blanking deflector array, and performing blanking of the at least one by scanning, on the substrate, the first plurality of charged particle beams, the second plurality of charged particle beams, and the third plurality of charged particle beams,
wherein, in order to reduce bending of the thin plate, in the aperture array, a spacer between the first sub array and the second sub array and a spacer between the second sub array and the third sub array are arranged,
wherein a space between the second sub array and the third sub array is set narrower than a space between the first sub array and the second sub array, so that a first sub array drawing region, on which drawing with the first plurality of charged particle beams is performed, does not cross over a boundary between the first shot region and the second shot region, a second sub array drawing region, on which drawing with the second plurality of charged particle beams is performed, does not cross over the boundary, and a third sub array drawing region, on which drawing with the third plurality of charged particle beams is performed, crosses over the boundary, and
wherein controlling comprises controlling the deflector array, the driving device, and the blanking deflector array, so that, in parallel with the drawing on the first sub array drawing region being performed and the drawing on the second sub array drawing region being performed, drawing on the first shot region side of the boundary is not performed and drawing on the second shot region side of the boundary is performed on the third sub array drawing region.

* * * * *